US007777215B2

(12) United States Patent
Chien et al.

(10) Patent No.: US 7,777,215 B2
(45) Date of Patent: Aug. 17, 2010

(54) RESISTIVE MEMORY STRUCTURE WITH BUFFER LAYER

(75) Inventors: Wei-Chih Chien, Sijhih (TW); Kuo-Pin Chang, Miaoli County (TW); Erh-Kun Lai, Longjing Shiang (TW); Kuang Yeu Hsieh, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 17 days.

(21) Appl. No.: 12/176,183

(22) Filed: Jul. 18, 2008

(65) Prior Publication Data
US 2009/0020740 A1 Jan. 22, 2009

Related U.S. Application Data
(60) Provisional application No. 60/950,874, filed on Jul. 20, 2007.

(51) Int. Cl.
*H01L 47/00* (2006.01)
(52) U.S. Cl. .............. 257/4; 257/5; 257/289; 257/E27.104; 257/E29.17; 438/900; 365/148
(58) Field of Classification Search .......... None
See application file for complete search history.

(56) References Cited
U.S. PATENT DOCUMENTS

| 3,271,591 A | 9/1966 | Ovshinsky |
| 3,530,441 A | 9/1970 | Ovshinsky |
| 3,872,359 A * | 3/1975 | Feuersanger ........ 257/43 |
| 4,452,592 A | 6/1984 | Tsai |
| 4,599,705 A | 7/1986 | Holmberg et al. |
| 4,719,594 A | 1/1988 | Young et al. |

(Continued)

FOREIGN PATENT DOCUMENTS
CN 1462478 12/2003

(Continued)

OTHER PUBLICATIONS

"Magnetic Bit Boost," www.sciencenews.org, Dec. 18 & 25, 2004, p. 389, vol. 166.

(Continued)

*Primary Examiner*—Evan Pert
*Assistant Examiner*—Scott R Wilson
(74) *Attorney, Agent, or Firm*—James F. Hann; Haynes Beffel & Wolfeld LLP

(57) ABSTRACT

A memory device comprises first and second electrodes with a memory element and a buffer layer located between and electrically coupled to them. The memory element comprises one or more metal oxygen compounds. The buffer layer comprises at least one of an oxide and a nitride. Another memory device comprises first and second electrodes with a memory element and a buffer layer, having a thickness of less than 50 Å, located between and electrically coupled to them. The memory comprises one or more metal oxygen compounds. An example of a method of fabricating a memory device includes forming first and second electrodes. A memory, located between and electrically coupled to the first and the second electrodes, is formed; the memory comprises one or more metal oxygen compounds and the buffer layer comprises at least one of an oxide and a nitride.

29 Claims, 5 Drawing Sheets

U.S. PATENT DOCUMENTS

| | | |
|---|---|---|
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,114 B2 | 11/2002 | Jong et al. |
| 6,489,645 B1 | 12/2002 | Uchiyama |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B2 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,477 B2 | 8/2003 | Uchiyama |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,805,563 B2 | 10/2004 | Ohashi et al. |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,029,924 B2 | 4/2006 | Hsu et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,067,864 B2 | 6/2006 | Nishida et al. |
| 7,067,865 B2 | 6/2006 | Lung et al. |

| Patent / Publication | Date | Name |
|---|---|---|
| 7,078,273 B2 | 7/2006 | Matsuoka et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,154,774 B2 | 12/2006 | Bedeschi et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,238,994 B2 | 7/2007 | Chen et al. |
| 7,248,494 B2 | 7/2007 | Oh et al. |
| 7,251,157 B2 | 7/2007 | Osada et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,393,798 B2 | 7/2008 | Campbell |
| 7,394,088 B2 | 7/2008 | Lung |
| 7,397,060 B2 | 7/2008 | Lung |
| 7,423,300 B2 | 9/2008 | Lung et al. |
| 7,426,134 B2 | 9/2008 | Happ et al. |
| 2002/0070457 A1 | 6/2002 | Sun et al. |
| 2002/0113273 A1 | 8/2002 | Hwang et al. |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0037546 A1 | 2/2005 | Yeh et al. |
| 2005/0062087 A1 | 3/2005 | Chen et al. |
| 2005/0093022 A1 | 5/2005 | Lung |
| 2005/0145984 A1 | 7/2005 | Chen et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0215009 A1 | 9/2005 | Cho |
| 2006/0006472 A1 | 1/2006 | Jiang |
| 2006/0038221 A1 | 2/2006 | Lee et al. |
| 2006/0054950 A1 | 3/2006 | Baek et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0131628 A1 | 6/2006 | Tseng et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0194403 A1 | 8/2006 | Li et al. |
| 2006/0226409 A1 | 10/2006 | Burr et al. |
| 2006/0234138 A1 | 10/2006 | Fehlhaber et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0286762 A1 | 12/2006 | Tseng et al. |
| 2006/0289848 A1* | 12/2006 | Dennison ........................ 257/3 |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0096162 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |

| | | | |
|---|---|---|---|
| 2008/0191187 | A1 | 8/2008 | Lung et al. |
| 2008/0192534 | A1 | 8/2008 | Lung |
| 2008/0224119 | A1 | 9/2008 | Burr et al. |
| 2008/0225489 | A1 | 9/2008 | Cai et al. |
| 2009/0001343 | A1* | 1/2009 | Schricker et al. ............... 257/4 |
| 2009/0027963 | A1* | 1/2009 | Bhattacharyya ........ 365/185.03 |

FOREIGN PATENT DOCUMENTS

| | | |
|---|---|---|
| CN | 1574363 A | 2/2005 |
| CN | 1779947 A | 5/2006 |
| TW | 452607 B | 9/2001 |
| WO | WO 0079539 | 12/2000 |
| WO | WO 0145108 | 6/2001 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, pp. 1-6.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., "OUM-A 180 nm Nonvolatile Memory Cell Element Technology for Stand Alone and Embedded Applications, IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase -Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Baek, I.G., et al., "Highly Scalable Non-volatile Resistive Memory using Simple Binary Oxide Driven by Asymmetric Unipolar Voltage Pulses," IEEE IEDM, 04-587, (2004) 4 pages.

Baek, I.G., et al., "Multi-layer Cross-point Binary Oxide Resistive Memory (OxRRAM) for Post-NAND Storage Application," IEEE (2005), 4 pages.

Bringans, R.D., et al., "Defect states in WO3 studied with photoelectron spectroscopy," Phys. Rev. B., v. 24, No. 6, Sep. 15, 1981, 9 pages.

Chen, An, et al., "Non-Volatile Resistive Switching for Advanced Memory Applications," IEEE (2005) 4 pages.

Ho, Chiahua, et al., "A 2-bit/cell, Maskless, Self-Aligned Resistance Memory with High Thermal Stability," Int'l Symp. on VLSI-TSA 2007, Apr. 23-25, 2007, 2 pages.

Ho, Chiahua, et al., "A Highly Reliable Self-Aligned Graded Oxide WOx Resistance Memory: Conduction Mechanisms and Reliability," 2007 IEEE Symp. on VLSI Tech., Jun. 12-14, 2007, 228-229.

Kim, D.C., et al., "Improvement of resistive memory switching in NiO using IrO2," Appl. Phys. Lett., 88, 232106 (2006) 3 pages.

Kozicki, Michael N., et al., "A Low-Power Nonvolatile Switching Element Based on Copper-Tungsten Oxide Solid Electrolyte," IEEE Trans. on Nanotechnology, V. 5, No. 5, Sep. 2006, 10 pages.

Kozicki, Michael N., et al., "A Low-Power Nonvolatile Switching Element Based on Copper-Tungsten Oxide Solid Electrolyte," 2005 Silicon Nanoelectronics Workshop, Kyoto, Japan, Jun. 12-13, 2005, pp. 34 and 35.

Seo, S., et al., "Conductivity switching characteristics and reset currents in NiO Films," Appl. Phys. Lett. 86, 093509 (2005), 3 pages.

Seo, S., et al., "Reproducible resistance switching in polycrystalline NiO films," Appl. Phys. Lett., vol. 85, No. 23, Dec. 6, 2004, 3 pages.

* cited by examiner

RESISTIVE MEMORY STRUCTURE WITH BUFFER LAYER

CROSS-REFERENCE TO OTHER APPLICATIONS

This application is related to the following U.S. patent applications: Resistance Random Access Memory Structure for Enhanced Retention, application Ser. No. 11/560,723, filed 16 Nov. 2006; and Resistance Memory with Tungsten Compound and Manufacturing, application Ser. No. 11/955, 137, filed 12 Dec. 2007.

This application claims the benefit of U.S. provisional patent application No. 60/950,874 filed 20 Jul. 2007.

BACKGROUND OF THE INVENTION

1. Field of the Invention

The present invention relates to memory devices and methods for manufacturing high density memory devices, and more particularly to memory devices having a data storage material based on tungsten-oxygen compounds.

2. Description of Related Art

Nonvolatile memory devices include magnetic random access memory MRAM, ferroelectric random access memory FRAM and phase-change random access memory PCRAM and other resistive random access memory RRAM. RRAM has attracted much attention because of its simple structure and small cell size.

Metal-oxide based RRAM can be caused to change resistance between two or more stable ranges by application of electrical pulses at levels suitable for implementation in integrated circuits, and the resistance can be read and written with random access to indicate stored data.

NiO, $TiO_2$, $HfO_2$, and $ZrO_2$ based RRAM have been investigated for use as a memory material in memory cells. See, Baek, et al., "Highly Scalable Non-Volatile Resistive Memory using Simple Binary Oxide Driven by Asymmetric Unipolar Voltage Pulses", IEDM Technical Digest pp. 23.6.1-23.6.4, IEEE International Electron Devices Meeting 2004. These memory cells are formed by a non-self-aligned process in a M-I-M structure, where M is a noble metal acting as an electrode and I is one of NiO, $TiO_2$, $HfO_2$, and $ZrO_2$. This MIM structure requires several additional masks and patterning to form the noble metal electrodes and the memory material, and results in a relatively large memory cell size.

$Cu_xO$ based RRAM has also been investigated for use as a memory material in memory cells. See, Chen et al., "Non-Volatile Resistive Switching for Advanced Memory Applications", IEDM Technical Digest pp. 746-749, IEEE International Electron Devices Meeting 2005. The $Cu_xO$ material is formed by thermal oxidation of a copper via which acts as the bottom electrode for the memory cell, while the top electrode consists of a bi-layer Ti/TiN film that is deposited and etched. This structure requires several additional masks to form the top and bottom electrodes, and results in a relatively large memory cell size. Chen et al. disclose that having a copper bottom electrode complicates erasing of the memory cell since the applied field during erasing may push copper ions into the $Cu_xO$. Additionally, $Cu_xO$ has a relatively small resistance window of 10×.

Cu—$WO_3$ based RRAM has also been investigated for use as a memory material in memory cells. See, Kozicki et al., "A Low-Power Nonvolatile Switching Element Based on Copper-Tungsten Oxide Solid Electrolyte", IEEE Transactions on Nanotechnology pp. 535-544, Vol. 5, No. 5, September 2006. Switching elements fabricated using tungsten metal, a solid electrolyte based on tungsten-oxide and photodiffused copper, and a copper top electrode are disclosed. The switching element is formed by tungsten-oxide grown or deposited on tungsten material, a layer of Cu formed on the tungsten-oxide and the Cu photodiffused into the tungsten-oxide to form the solid electrolyte, and a Cu layer is formed and patterned over the solid electrolyte to act as a top electrode. The switching element changes resistance by applying a bias voltage to cause electrodeposition of Cu ions from the top electrode into the solid electrolyte, and states that "a lack of Cu in the top electrode results in no measurable switching activity" (see page 539, column 1). This structure thus needs a Cu top electrode, involves several process steps to form the solid electrolyte, and necessitates bias voltages of opposite polarities to cause the injection of Cu ions to program and erase the solid electrolyte.

SUMMARY OF THE INVENTION

An example of a memory device comprises first and second electrodes with a memory element and a buffer layer located between and electrically coupled to the first and second electrodes. The memory element comprises one or more metal oxygen compounds. The buffer layer comprises at least one of an oxide and a nitride. In some example is the buffer layer has a thickness of less than 50 Å. In some example is the memory element comprises one or more tungsten oxygen compounds. In some examples the buffer layer comprises at least one of the following: SiO2, WO, TiO, NiO, AlO, CuO, ZrO, Si3N4, and TiN. In some examples memory element comprises one or more of the following: WOx, NiO, Nb2O5, CuO2, Ta2O5, Al2O3, CoO, Fe2O3, HfO2, TiO2, SrTiO3, SrZrO3, (BaSr)TiO3, GeTi, SnMnTe, SbTe, Pr1-xCaxMnO3, (Te—Cu/GdOX, GeSb with Ag+ or Cu+).

A second example of a memory device comprises a first electrode and a second electrode with a memory element and a buffer layer located between and electrically coupled to the first and the second electrodes. The memory comprises one or more metal oxygen compounds. The buffer layer has a thickness of less than 50 Å.

An example of a method of fabricating a memory device is carried out as follows. A first electrode and a second electrode are formed. A memory, located between and electrically coupled to the first and the second electrodes, is formed; the memory comprises one or more metal oxygen compounds and the buffer layer comprises at least one of an oxide and a nitride. In some examples the buffer layer is located between and electrically coupled to the memory element and the first electrode. In some examples the buffer layer has a thickness of less than 50 Å. In some examples the buffer layer has a resistivity of about $10^{13}$~$10^{16}$ ohm-cm. In some examples a second buffer layer is formed between and electrically coupled to the memory element and the second electrode, the second buffer layer comprising at least one of an oxide and a nitride.

Advantageously, the present invention improves the performance, including data retention and cycle endurance, of a resistive memory structure.

The structures and methods of the present invention are disclosed in the detailed description below. This summary does not purport to define the invention. The invention is defined by the claims. These and other embodiments, features, aspects, and advantages of the technology can be understood with regard to the following description, appended claims and accompanying drawings.

BRIEF DESCRIPTION OF THE DRAWINGS

The invention will be described with respect to specific embodiments thereof, and reference will be made to the drawings, in which.

DETAILED DESCRIPTION

Figure 1:
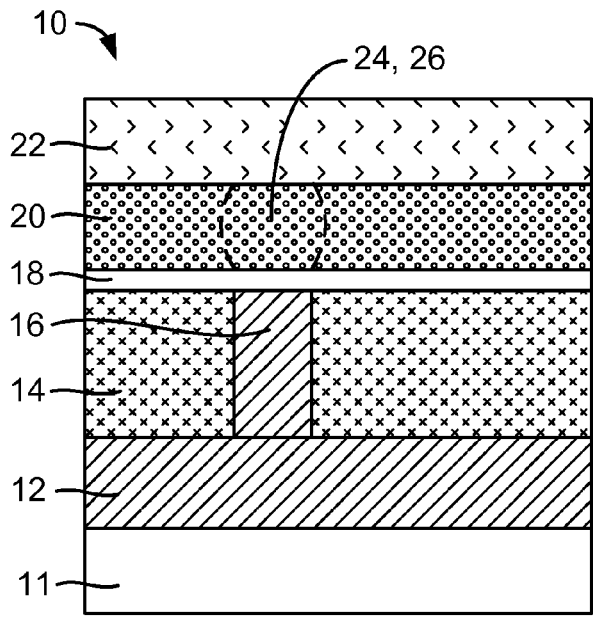
FIG. 1 is a simplified cross-sectional view of an example of a resistive memory structure in accordance with the present invention with a barrier layer between the bottom electrode and the memory cell.

A description of structural embodiments and methods of the present invention is provided with reference to FIGS. 1-9. It is to be understood that there is no intention to limit the invention to the specifically disclosed embodiments but that the invention may be practiced using other features, elements, methods and embodiments. Like elements in various embodiments are commonly referred to with like reference numerals.

FIG. 1 is a simplified cross-sectional view of a first example of a resistive memory structure 10. Structure 10 includes a substrate 11 upon which an AlCu stack 12 is formed. A dielectric layer 14, typically silicon dioxide, is formed over stack 12. A bottom electrode 16 extends from stack 12 completely through dielectric layer 14. Bottom electrode 16 is an electrically conductive element. For example, bottom electrode 16 may be a drain terminal of an access transistor or a terminal of a diode. A buffer layer 18 is formed by, for example, down-stream plasma, plasma sputtering or reactive sputtering onto dielectric layer 14 and bottom electrode 16. Buffer layer 18 has a thickness of less than 50 Å; the advantages accruing from the use of buffer layer 18 will be discussed below. Buffer layer 18 comprises at least one of an oxide and a nitride. For example, buffer layer 18 may comprise at least one of the following: $SiO_2$, WO, TiO, NiO, AlO, CuO, ZrO, $Si_3N_4$, and TiN. Buffer layer 18 preferably exhibits a resistivity of about $10^{13} \sim 10^{16}$ ohm-cm and preferably has a thickness of less than 5 nm (50 Å) Buffer layer 18 may be formed by, for example, physical vapor deposition or chemical vapor deposition methods.

A memory element layer 20, having a thickness of 50-1000 Å, is deposited on buffer layer 18. Memory element layer 20 comprises one or more metal-oxygen compounds, especially tungsten-oxygen compounds $W_xO_y$, for example one or more of $WO_3$, $W_2O_5$, $WO_2$. In some cases, such as when plasma oxidation or thermal oxidation is used to form memory element layer 20, the result can be a number of different tungsten-oxygen compounds. In one example memory element layer 20 comprises $WO_3/W_2O_5/WO_2$ and has a thickness of about 140 Å. A top electrode 22 is formed on memory element layer 20. Electrodes 16, 22 are typically a metal such as tungsten or AlCu. The portions of the bottom and top electrodes 16, 22 that are aligned define a memory cell region 24 therebetween. The portion of memory element layer 20 situated within memory cell region 24 constitutes a memory element 26 electrically coupled to bottom and top electrodes 16, 22. Memory element 26 may comprise one or more of the following: $WO_x$, NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$, GeTi, SnMnTe, SbTe, $Pr_{1-x}Ca_xMnO_3$, (Te—Cu/GdOX, GeSb with Ag+ or $Cu^+$).

In operation, voltages applied to the top and bottom electrodes 22, 16 will cause current to flow between the top and bottom electrodes via memory element 26 and can induce a programmable change in electrical resistance of the memory element 26, the electrical resistance indicating a data value stored in the memory element 26. In some embodiments memory element 26 can store two or more bits of data.

Figure 2:
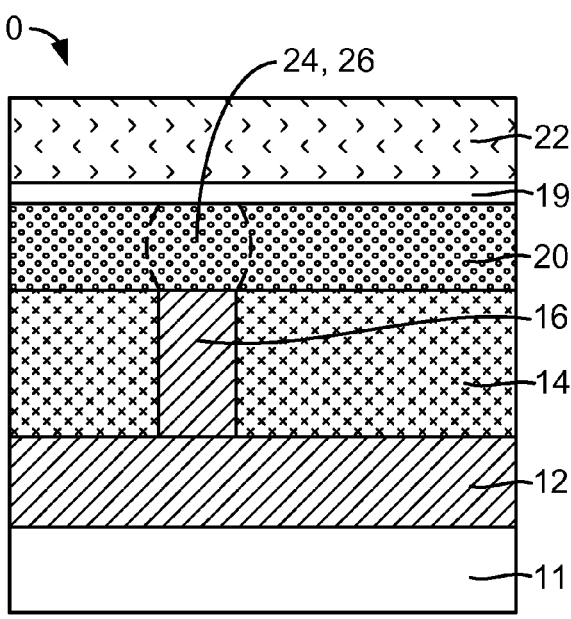
FIG. 2 is a simplified cross-sectional view of another example of a resistive memory structure similar to that of FIG. 1 but where the buffer layer is between the memory cell and the top electrode.
Figure 3:
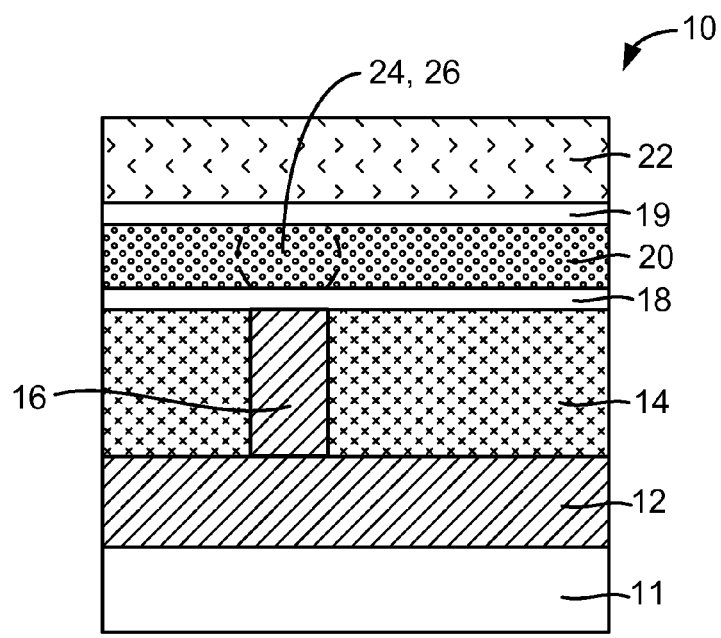
FIG. 3 is a simplified cross-sectional view of a further example of a resistive memory structure similar to that of FIG. 1 including a buffer layer between the bottom electrode and the memory cell as in FIG. 1 and a buffer layer between the top electrode and the memory cell as in FIG. 2.

FIG. 2 is a simplified cross-sectional view of another example of a resistive memory structure 10 similar to that of FIG. 1 but without buffer layer 18 but including a buffer layer 19 between memory element 26 and at top electrode 22. FIG. 3 is a simplified cross-sectional view of a further example of a resistive memory structure 10 including a buffer layer 18 between bottom electrode 16 and memory element 26 as in FIG. 1 and a buffer layer 19 between top electrode 22 and the memory element 26 as in FIG. 2.

Resistive memory structure 10 can be manufactured using conventional back-end-of-line W-plug processing techniques. A single mask can be used to form both buffer layer 19 and top electrode 22.

The use of one or both of buffer layers 18, 19 helps to improve the performance of resistive memory structure 10. This improvement in performance will be demonstrated with reference to FIGS. 4-8. The structure of FIG. 1 was used to develop the results seen at FIGS. 5, 7 and 8. The test structure had the following characteristics: bottom electrode 16 was made of W and had an average diameter of about 200 nm; top electrode 22 was made of Al and had an average width of about 500 nm; memory element layer 20 was made of $WO_x$ and a thickness of about 140 Å; buffer layer 18 was made of $SiO_2$ and had a thickness of about 2 nm. The results shown at FIGS. 4 and 6 are for a resistive memory structure substantially identical to the test structure but without any buffer layers, referred to below as the conventional resistive memory structure.

Figure 4:
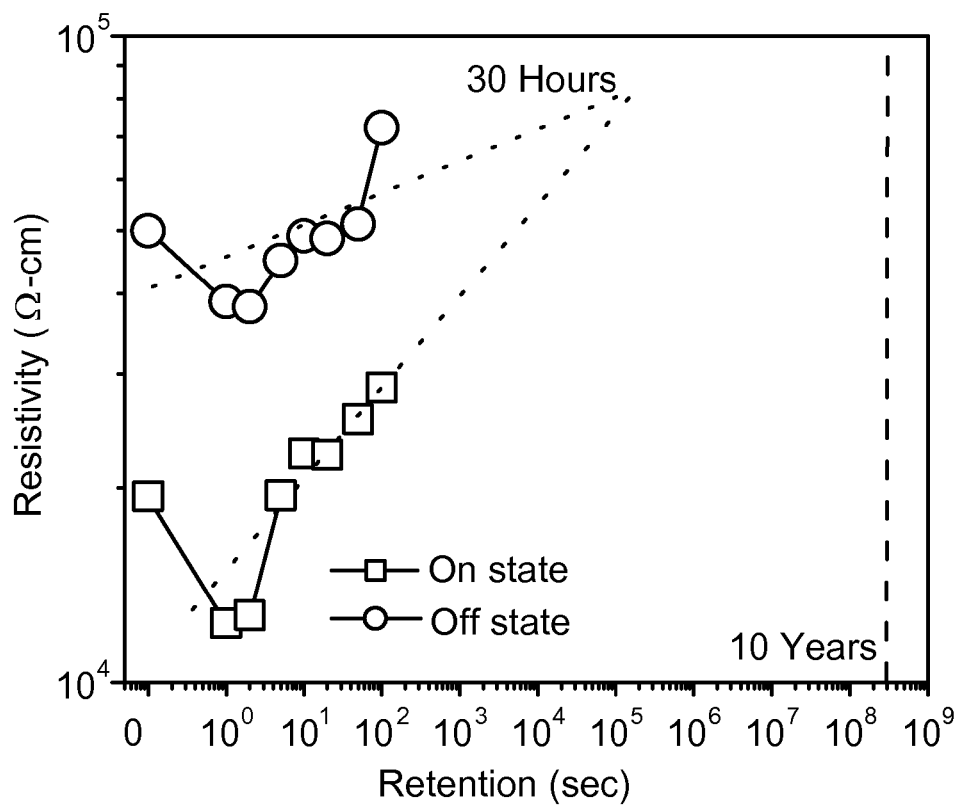
FIG. 4 is a graph of resistivity versus retention time for a resistive memory structure of the type not including a buffer layer.
Figure 5:
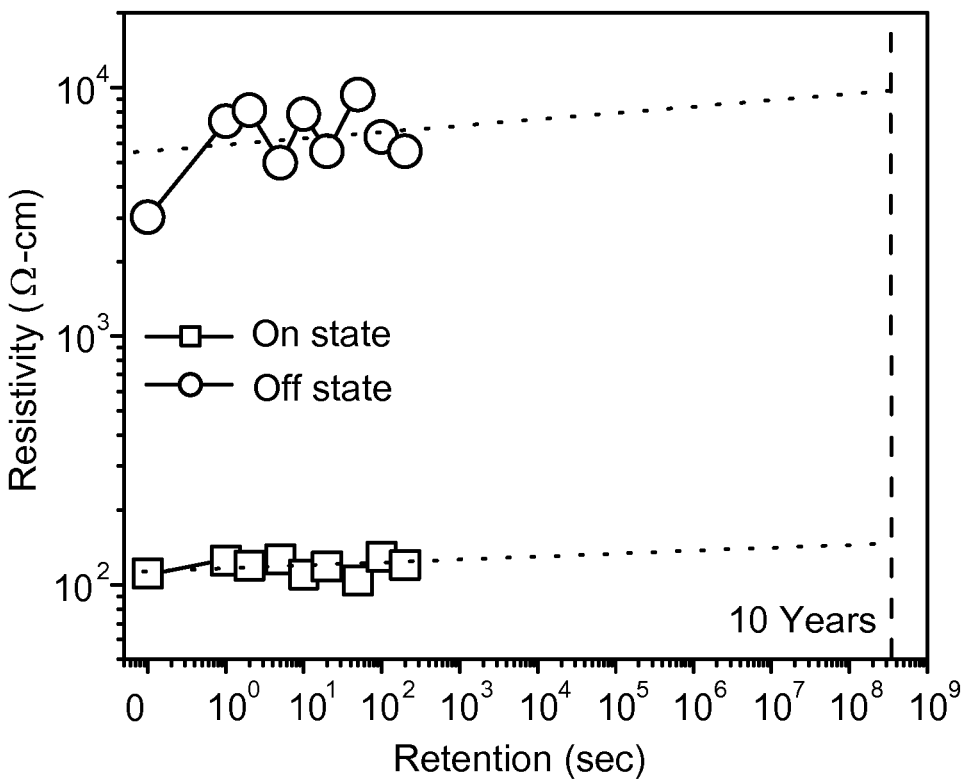
FIG. 5 is a graph of resistivity versus retention time for a resistive memory structure made according to the invention showing the improved data retention over the data retention illustrated in FIG. 4.

FIG. 4 is a graph of resistivity versus retention time for the conventional resistive memory structure in both the on state and the off state. It can be seen that the resistivity, especially in the on state, increases relatively quickly over time, time being plotted on a logarithmic scale. In contrast, the plot of resistivity versus retention time for resistive memory structure 10 is seen in FIG. 5 to be essentially flat, a substantial improvement over the conventional resistive memory structure used to create the graph of FIG. 4.

Figure 6:
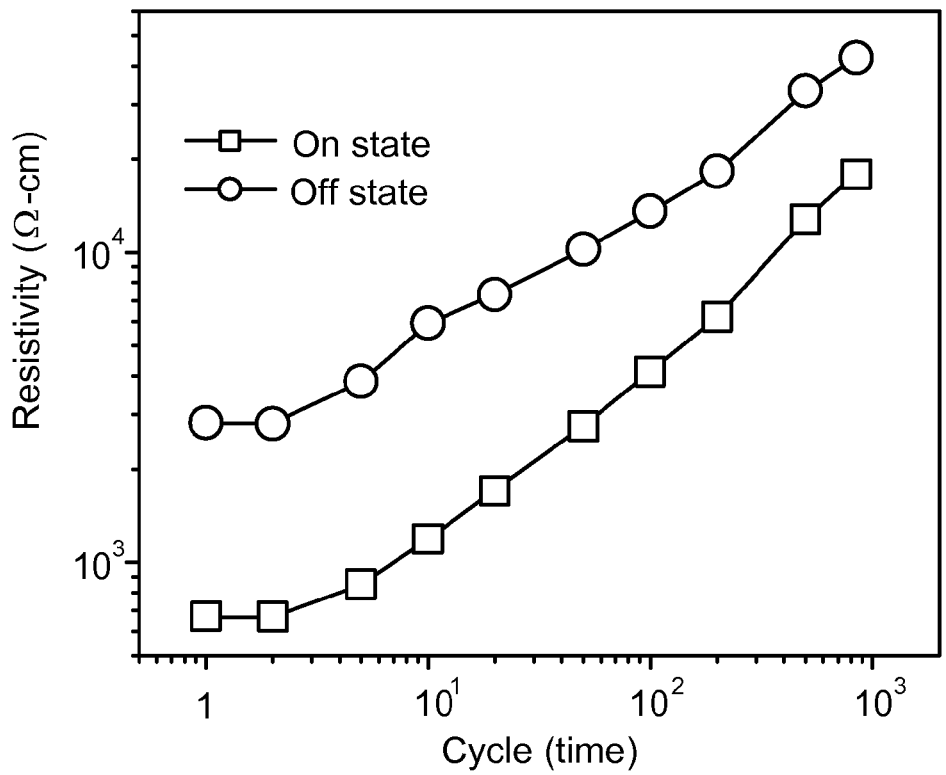
FIG. 6 is a graph of resistivity versus cycle time for a memory structure of the type not including a buffer layer.
Figure 7:
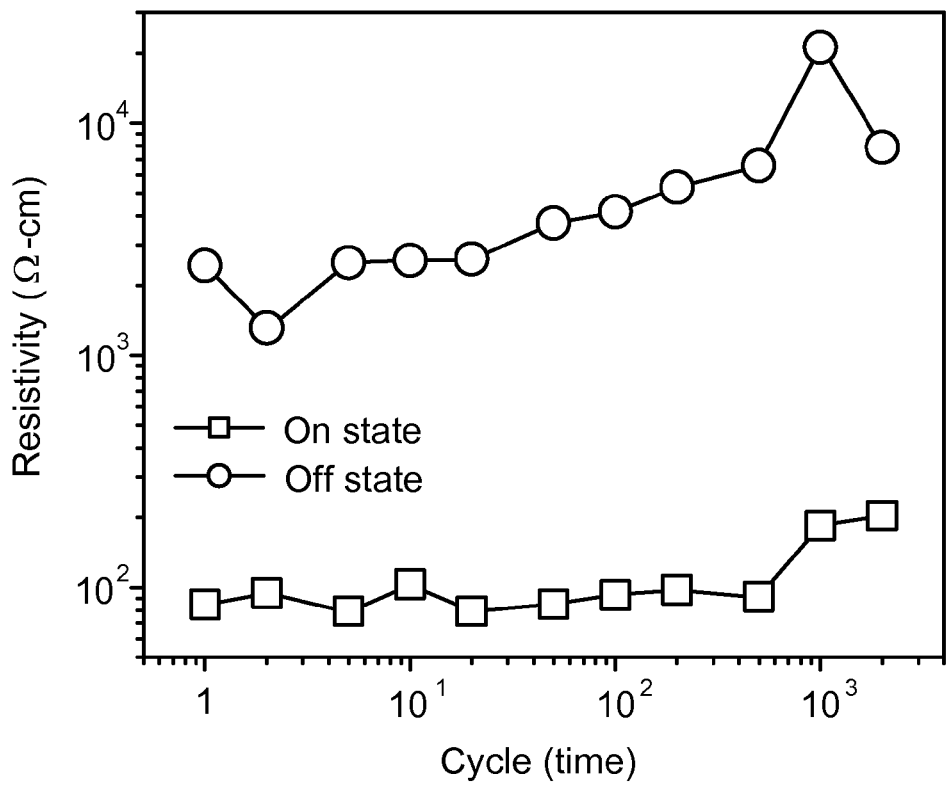
FIG. 7 is a graph of resistivity versus cycle time for a resistive memory structure made according to the invention showing the improved cycle endurance over the cycle endurance illustrated in FIG. 6.

FIG. 6 is a graph of resistivity versus cycle time for the conventional resistive memory structure. Graphs for both the on state and the off state show significant increases in the resistivity over cycle time. In contrast, the graph of FIG. 7 of resistivity versus cycle time for resistive memory structure 10 shows a relatively flat resistivity versus cycle time plots for both the on state and the off state. This indicates substantially improved cycle endurance for resistive memory structure 10 over the cycle endurance of the conventional resistive memory structure used to create the graph in FIG. 6.

Figure 8:
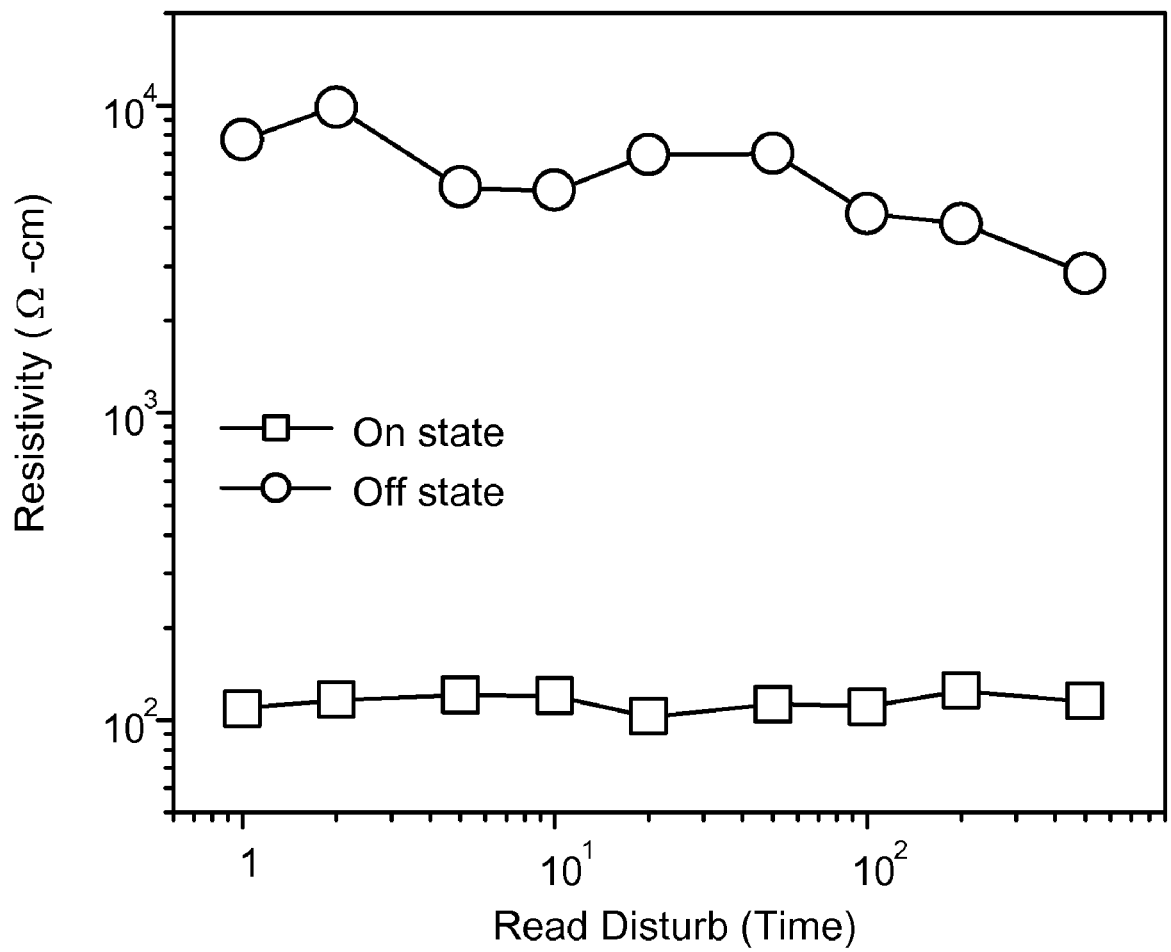
FIG. 8 is a graph of resistivity versus read disturb for a resistive memory structure made according to the invention showing that it exhibits very good read disturb characteristics in both the on state and the off state.

FIG. 8 is a graph of resistivity versus read disturb for resistive memory structure 10 showing that the resistivity of structure 10 exhibits very good read disturb characteristics in both the on state and the off state. Read disturb refers to the gain or loss of resistance of memory element 26 resulting from reading the state of the memory element 26.

Figure 9:
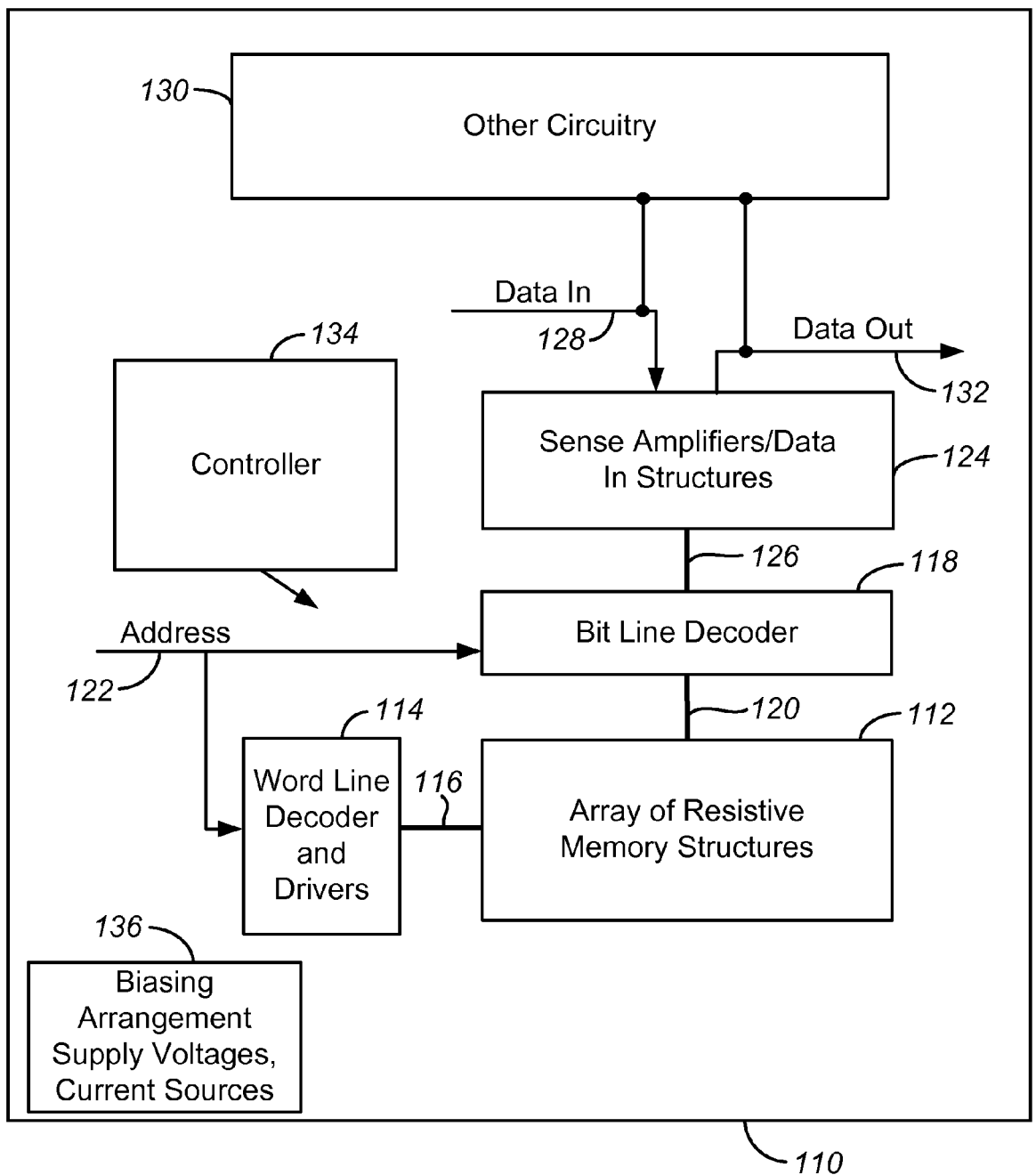
FIG. 9 is a simplified block diagram of an integrated circuit including resistive memory structures.

FIG. 9 is a simplified block diagram of an integrated circuit 110 including a memory array 112 implemented using resistive memory structures 10. A word line decoder 114 having read, set and reset modes is coupled to and in electrical communication with a plurality of word lines 116 arranged along rows in the memory array 112. A bit line (column) decoder 118 is in electrical communication with a plurality of bit lines 120 arranged along columns in the array 112 for reading, setting, and resetting memory element 26 in array 112. Addresses are supplied on bus 122 to word line decoder and drivers 114 and bit line decoder 118. Sense amplifiers and data-in structures in block 124, including voltage and/or current sources for the read, set, and reset modes are coupled to bit line decoder 118 via data bus 126. Data is supplied via a data-in line 128 from input/output ports on integrated circuit 110, or from other data sources internal or external to integrated circuit 110, to data-in structures in block 124. Other circuitry 130 may be included on integrated circuit 110, such as a general purpose processor or special purpose application circuitry, or a combination of modules providing system-on-a-chip functionality supported by array 112. Data is supplied via a data-out line 132 from the sense amplifiers in block 124 to input/output ports on integrated circuit 110, or to other data destinations internal or external to integrated circuit 110.

A controller 134 implemented in this example, using a bias arrangement state machine, controls the application of bias arrangement supply voltages and current sources 136, such as read, program, erase, erase verify and program verify voltages and/or currents. Controller 134 may be implemented using special-purpose logic circuitry as known in the art. In alternative embodiments, controller 134 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 134.

An exemplary formation method for $W_xO_y$ uses a PVD sputtering or magnetron-sputtering method with reactive gases of Ar, $N_2$, $O_2$, and/or He, etc. at a pressure of 1 mTorr~100 mTorr, using a target of $W_xO_y$. The deposition is usually performed at room temperature. A collimater with an aspect ratio of 1~5 can be used to improve the fill-in performance. To improve the fill-in performance, the DC bias of several tens of volts to several hundreds of volts is also used. If desired, DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an annealing time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minutes to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of W. The oxidation time ranges several seconds to several minutes. The oxidation temperature ranges from room temperature to 300° C., depending on the degree of plasma oxidation.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims. For example, a transition or protective layer of material could be used between the buffer layer and one or both of the memory element and an electrode.

Any and all patents, patent applications and printed publications referred to above are incorporated by reference.

What is claimed is:

1. A memory device comprising:
    a first electrode and a second electrode;
    a metal oxide resistive random access memory element and a buffer layer located between and electrically coupled to the first and the second electrodes, the memory element comprising one or more metal oxygen compounds; and
    the buffer layer comprising $SiO_2$.

2. The memory device according to claim 1, wherein the buffer layer is located between and electrically coupled to the memory element and the first electrode.

3. The memory device according to claim 2, further comprising a second buffer layer located between and electrically coupled to the memory element and the second electrode, the second buffer layer comprising at least one of an oxide and a nitride.

4. The memory device according to claim 3, wherein the second buffer layer has a thickness of less than 50 Å.

5. The memory device according to claim 1, wherein the buffer layer has a thickness of less than 50 Å.

6. The memory device according to claim 1, wherein the buffer layer has a resistivity of about $10^{13}$~$10^{16}$ ohm-cm.

7. The memory device according to claim 1, wherein the memory element has a thickness, measured between the first and second electrodes, of 50-1000 Å.

8. The memory device according to claim 1, wherein the memory element comprises at least one of the following: $WO_x$, $NiO$, $Nb_2O_5$, $CuO_2$, $Ta_2O_5$, $Al_2O_3$, $CoO$, $Fe_2O_3$, $HfO_2$, $TiO_2$, $SrTiO_3$, $SrZrO_3$, $(BaSr)TiO_3$.

9. The memory device according to claim 1, wherein the buffer layer comprises buffer layer means for improving resistivity versus a retention time and cycle endurance of the memory device.

10. A memory device comprising:
    a first electrode and a second electrode over the first electrode;
    a metal oxide resistive random access memory element located between and electrically coupled to the first and the second electrodes, the memory element comprising one or more metal oxygen compounds;
a buffer layer located between and electrically coupled to the first and second electrodes and directly contacting the second electrode; and
the buffer layer having a thickness of less than 50 Å.

11. The memory device according to claim 10, wherein the memory element comprises at least one of the following: $WO_x$, $NiO$, $Nb_2O_5$, $CuO_2$, $Ta_2O_5$, $Al_2O_3$, $CoO$, $Fe_2O_3$, $HfO_2$, $TiO_2$, $SrTiO_3$, $SrZrO_3$, $(BaSr)TiO_3$, $Pr_{1-x}Ca_xMnO_3$.

12. The memory device according to claim 10, wherein the buffer layer has a resistivity of about $10^{13} \sim 10^{16}$ ohm-cm.

13. The memory device according to claim 10, further comprising a second buffer layer located between and electrically coupled to the memory element and the second electrode, the second buffer layer comprising at least one of an oxide and a nitride.

14. The memory device according to claim 13, wherein the second buffer layer has a thickness of less than 50 Å.

15. The memory device according to claim 10, wherein the memory element has a thickness, measured between the first and second electrodes, of 50-1000 Å.

16. The memory device according to claim 10, wherein the buffer layer comprises at least one of the following: WO, TiO, NiO, AlO, CuO, ZrO, $Si_3N_4$, and TiN.

17. The memory device according to claim 10 wherein the buffer layer comprises $SiO_2$.

18. The memory device according to claim 10, wherein the buffer layer comprises buffer layer means for improving resistivity versus a retention time and cycle endurance of the memory device.

19. A method of fabricating a memory device, comprising:
forming a first electrode and a second electrode;
forming a metal oxide resistive random access memory element located between and electrically coupled to the first and the second electrodes, the memory element comprising one or more metal oxygen compounds; and
forming a buffer layer between the first and second electrodes, the buffer layer coupling the first and second electrodes, the buffer layer comprising $SiO_2$.

20. The method according to claim 19, wherein the buffer layer is formed by down-stream plasma, plasma sputtering or reactive sputtering.

21. The method according to claim 19, wherein the memory element is formed by plasma oxidation or thermal oxidation.

22. The method according to claim 19, wherein the buffer layer is located between and electrically coupled to the memory element and the first electrode.

23. The method according to claim 22, further comprising forming a second buffer layer located between and electrically coupled to the memory element and the second electrode, the second buffer layer comprising $SiO_2$.

24. The method according to claim 23, wherein the second buffer layer has a thickness of less than 50 Å.

25. The method according to claim 19, wherein the buffer layer has a thickness of less than 50 Å.

26. The method according to claim 19, wherein the buffer layer has a resistivity of about $10^{13} \sim 10^{16}$ ohm-cm.

27. The method according to claim 19, wherein the memory element has a thickness, measured between the first and second electrodes, of 50-1000 Å.

28. The method according to claim 19, wherein the memory element comprises at least one of the following: $WO_x$, $NiO$, $Nb_2O_5$, $CuO_2$, $Ta_2O_5$, $Al_2O_3$, $CoO$, $Fe_2O_3$, $HfO_2$, $TiO_2$, $SrTiO_3$, $SrZrO_3$, $(BaSr)TiO_3$, GeTi, SnMnTe, SbTe, $Pr_{1-x}Ca_xMnO_3$, (Te—Cu).

29. The method according to claim 19, wherein the buffer layer forming step comprises forming buffer layer means for improving resistivity versus a retention time and cycle endurance of the memory device.

* * * * *